(12) United States Patent
Mitteregger et al.

(10) Patent No.: US 7,405,687 B2
(45) Date of Patent: Jul. 29, 2008

(54) CONTINUOUS-TIME DELTA-SIGMA ANALOG DIGITAL CONVERTER

(75) Inventors: Gerhard Mitteregger, Taufkirchen (DE); Christian Ebner, Munich (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/605,919

(22) Filed: Nov. 29, 2006

(65) Prior Publication Data
US 2007/0139240 A1    Jun. 21, 2007

(30) Foreign Application Priority Data
Dec. 2, 2005    (DE)    ........................ 10 2005 057 768

(51) Int. Cl.
*H03M 3/00* (2006.01)
(52) U.S. Cl. ........................................ 341/143; 341/155
(58) Field of Classification Search ................ 341/143, 341/144, 155
See application file for complete search history.

(56) References Cited

U.S. PATENT DOCUMENTS

| | | | | |
|---|---|---|---|---|
| 5,278,559 | A * | 1/1994 | Yazawa | 341/143 |
| 5,729,230 | A * | 3/1998 | Jensen et al. | 341/143 |
| 6,414,615 | B1 | 7/2002 | Cheng | 341/143 |
| 6,462,687 | B1 * | 10/2002 | Eshraghi et al. | 341/143 |
| 6,614,377 | B1 * | 9/2003 | Adams et al. | 341/144 |
| 6,768,435 | B2 * | 7/2004 | Xu | 341/143 |
| 6,940,436 | B2 * | 9/2005 | Hezar et al. | 341/143 |
| 7,026,970 | B2 * | 4/2006 | Wang et al. | 341/143 |
| 7,034,728 | B2 * | 4/2006 | Luh et al. | 341/143 |
| 2005/0093732 | A1 | 5/2005 | Clara et al. | 341/155 |

FOREIGN PATENT DOCUMENTS

DE    103 42 057 A1    5/2005

OTHER PUBLICATIONS

Weinan Gao et al., "Excess Loop Delay Effects in Continuous-Time Delta-Sigma Modulators and the Compensation Solution"; 1997 IEEE International Symposium on Circuits and Systems, Hong Kong, Jun. 9-12, 1997; pp. 65-68.

* cited by examiner

*Primary Examiner*—Peguy JeanPierre
(74) *Attorney, Agent, or Firm*—Pearne & Gordon LLP

(57) ABSTRACT

The invention relates to a continuous-time delta-sigma analog digital converter (10) for converting an analog input signal (IN) to a digital output signal (OUT), comprising an analog filter (20), which filters the analog input signal, a quantifier (30) cycled by a clock signal (CLK), which quantifier quantifies the filtered analog signal transmitted by the analog filter (20) to generate the digital output signal, and a feedback device (40) with at last one digital analog converter, which transmits at least one analog feedback signal based on the digital output signal (OUT) to the analog filter (20). To simplify the feedback without adversely affecting the converter stability and power consumption, provision is made, according to the invention, for the feedback device (40) for generating a feedback signal corresponding to the differentiated output signal of the quantifier, to comprise two digital analog converters (44-1, 44-2) to which the digital output signal (OUT) of the quantifier (30) is transmitted via a delay stage (42-1, 42-2) with different delays, and hose analog output signals are transmitted to an analog subtractor (24-3).

9 Claims, 3 Drawing Sheets

CONTINUOUS-TIME DELTA-SIGMA ANALOG DIGITAL CONVERTER

BACKGROUND TO THE INVENTION

Scope of the Invention

This invention relates to a continuous-time delta sigma analog-digital converter for converting an analog input signal to a digital output signal, comprising:
an analog filter which filters the analog input signal,
a quantifier cycled by a clock signal, which quantifier quantifies the filtered analog signal transmitted by analog filter for generating the digital output signal, and
a feedback device with at least one digital analog converter, which device transmits at least one analog feedback signal to analog filter on the basis of the digital output signal.

The invention further relates to a method for continuous-time delta-sigma analog digital conversion, comprising:
an analog filtering of the input signal,
a quantification of the filtered analog signal cycled by a clock signal for generating the digital output signal, and
a feedback comprising at least one digital analog conversion for supplying at least one analog feedback signal on the basis of the digital output signal during analog filtering.

DESCRIPTION OF THE STATE OF THE ART

Such a converter and such a conversion method are disclosed, for example, in DE 103 42 057 A1. In this state of the art the digital output signal of the quantifier is simultaneously transmitted to two digital analog converters and the converted (analog) signals are fed back to the analog filter at respective summation nodes.

A fundamental problem with conventional continuous-time delta-sigma analog digital converters is the interval of time, which is unavoidable in practice, between the time of quantification and the time of output and feedback of the digital output signal. The stability of the converter is adversely affected by this delay. Furthermore, the feedback devices (digital analog converter, summating amplifier, etc.) are relatively expensive and/or consume a great deal of power in the case of delta-sigma analog digital converters of prior art.

OUTLINE OF THE INVENTION

An object of this invention is to simplify feedback in a delta-sigma-analog-digital converter of the type already mentioned without adversely affecting converter stability and power consumption.

In a continuous-time delta-sigma analog digital converter this object is achieved essentially in that the feedback device for generating a feedback signal corresponding to the differentiated output signal of the quantifier comprises two digital analog converters to which the digital output signal of the quantifier is transmitted via a delay stage with different delays and whose analog output signals are transmitted to an analog subtractor.

In the case of the conversion method of the type already mentioned, the object is achieved essentially in that the feedback for generating a feedback signal corresponding to the differentiated output signal of the quantifier comprises two digital analog conversions in which the digital output signal of the quantification, with different delays, is subjected to the digital analog conversions and the digital analog converted signals are subtracted from one another.

According to the invention a feedback signal is generated in a manner that is simple in terms of circuit technology and enables power to be saved, which signal corresponds to the differentiated output signal of the quantifier. In a preferred embodiment this feedback signal is fed directly back to the filter. However, the possibility that this feedback signal could be subjected to further processing before feedback to the filter cannot be ruled out. For example, the feedback signal may be subject one again, or even several times, to differentiation before it is coupled into the analog filter. It is also conceivable for further signals to be generated on the basis of the feedback signal first generated, which corresponds to the differentiated output signal of the quantifier, which signals are then fed back to the analog filter at different points.

Due to the new kind of feedback path of the invention, for the operation of which a desired delay (between the input signals of the two digital analog converters) is provided in any case, the unavoidable delay of the quantifier may also be advantageously considered when designing the feedback device. In this case the delay is considered to be part of the system to be compensated, thus a noise transfer function with a high quantification noise suppression in the signal band, with a simultaneous adequate stability limit, is possible. Summating amplifiers, which consume a relatively large quantity of power and would introduce an additional delay into the system, necessitating a faster quantifier (with higher power consumption) or a less "aggressive" noise transfer function to maintain converter stability, may be dispensed with. Finally, a particularly advantageous so-called "return-to-zero" feedback signal may be generated with the solution according to the invention for the circuit environment of interest here.

In one embodiment provision is made for the delta-sigma analog digital converter to be constructed so that it is fully differential.

A preferred production technology for the delta-sigma analog digital converter is CMOS technology. In particular, the converter may represent a function block of an integrated circuit device.

The analog filter preferably comprises at least one integrator and/or one resonator. When reference is made in the following to an integrator, the possibility of using a resonator instead of this integrator cannot be ruled out. An input stage of the filter is preferably formed by an integrator and/or a stage connected immediately before the quantifier may be formed by an integrator. Such an integrator may, for example, comprise a capacitively fed back operational amplifier. Alternatively an integrator may, for example, comprise a so-called transconductance stage ("OTA") with a capacitive load.

In a preferred embodiment the feedback signal corresponding to the differentiated output signal of the quantifier may be transmitted (immediately or after further processing) to an integrator of the analog filter. This is preferably an integrator which is connected in series directly upstream of the quantifier.

In a known manner, a digital signal processor (DSP) can be connected downstream of the quantifier for further processing the digital output signal. In this case the digital output signal can be branched from a circuit node arranged between the quantifier and the digital signal processor and transmitted to the feedback device.

The delay stage is preferably designed as an arrangement of digital signal accumulators whose accumulator values are read in and/or out in a cycled manner. In this case cycling preferably takes place by means of a clock signal which is identical to the clock signal used for cycling the quantifier (or is derived from it).

In one embodiment provision is made for the digital output signal of the quantifier to be transmitted directly to the input of one of the two digital analog converters, whilst this output signal is transmitted via a delay element to the input of the other of the two digital analog converters.

In another embodiment provision is made for the delay stage to comprise:

a first delay element to which the digital output signal is transmitted, e.g. directly, and which supplies the digital output signal delayed by a first delay to the input of a first of the two digital analog converters, and a second delay element, to which the digital output signal delayed by the first delay is transmitted and which supplies this signal, delayed by a second delay, to the input of a second of the two digital analog converters.

In the latter variant provision is made, according to a preferred embodiment, for both the first delay and the second delay to correspond to half a cycle period of the clock signal.

The delay elements may each be designed as digital signal accumulators cycled by the clock signal, e.g. as signal accumulator registers such as flipflops, etc.

Both digital analog converters of the feedback device are preferably designed so that their analog output signals are current signals. Such signals may be subtracted from each other in a particularly simple, exact manner in terms of circuit arrangement, or, in an equivalent manner, may be added together with opposite polarity.

In one embodiment the quantifier has a plurality of quantification stages. In one embodiment, for example, 16 quantification stages (equivalent to 4 bits) are provided.

It is advantageous, both for fast quantification and for fast digital analog conversion in the feedback device, for the digital output signal of the quantifier to have thermometer coding.

BRIEF DESCRIPTION OF THE DRAWINGS

The invention is further described in the following by means of exemplary embodiments with reference to the attached drawings, in which.

DESCRIPTION OF THE PREFERRED EMBODIMENTS

Figure 1:
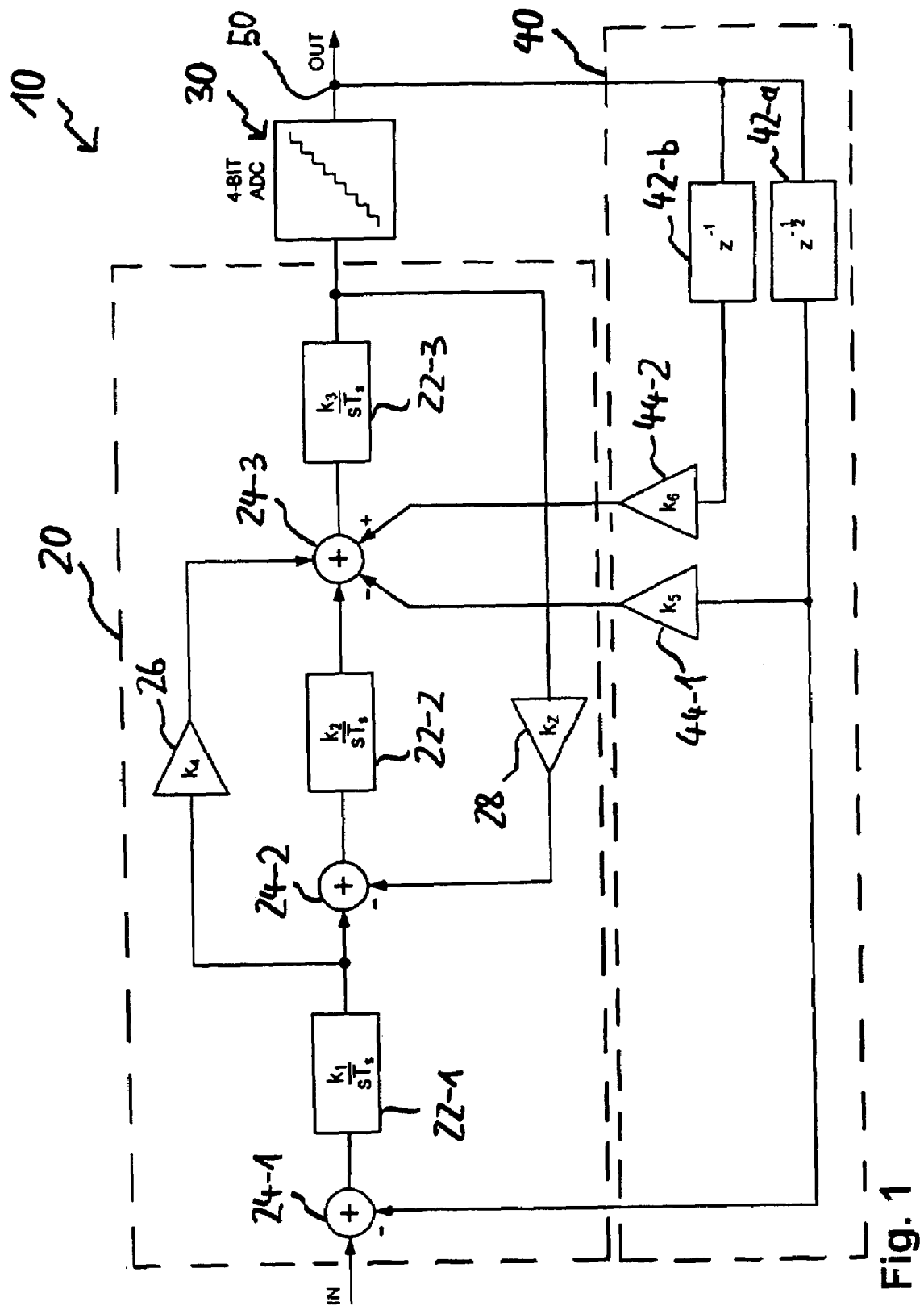
FIG. 1 shows a functional block diagram of a delta-sigma digital analog converter.

FIG. 1 illustrates diagrammatically the structure of a delta-sigma analog digital converter 10 for converting an analog input signal IN to a digital output signal OUT.

Converter 10 comprises an analog filter 20 for filtering analog input signal IN, a 4-bit quantizer 30 cycled by a clock signal for generating digital output signal OUT, by quantifying the signal transmitted by analog filter 20, and a feedback device 40 for feeding back analog feedback signals on the basis of digital output signal OUT.

Quite generally the integrated ("sigma") difference ("delta") between an analog input signal and an analog representation of the quantified digital output signal, in a delta-sigma analog digital converter, is transmitted to the quantifier (analog digital converter stage). In another embodiment of such a converter, also referred to as "delta modulator" in the narrower sense, the difference ("delta") between an analog input signal and the integral ("sigma") of the quantified digital output signal is transmitted to the quantifier. Due to the feedback the quantifier generates an output bit stream whose value follows the analog input signal in the time average. The continuous-time delta-sigma analog digital converter has the advantage over time-discrete delta-sigma analog digital converters of a lower power input and, at a predetermined power input, the advantage of a higher signal bandwidth.

Since time-discrete scanning or sampling takes place in a continuous-time delta-sigma analog digital converter in the region of the quantifier, and the values of the digital output signal are only of interest at discrete times, such converters and the signals generated on it are normally analyzed in the so-called Z-domain. The Z transformation assigns a function of the complex variables z to a sequence of numbers (here: signal value sequence). The aim here is to transform certain mathematical operations, which are difficult to control within the range of sequences, into simpler operations for the image functions.

Correspondingly FIG. 1 symbolizes the functions of the circuit components shown by mathematical operators in the Z-domain.

Analog filter 20 comprises, in the exemplary example shown, a plurality of integrators 22-1, 22-2 and 22-3 (integrator cascade), which, together with addition points 24-1, 24-2, 24-3, a forward coupling element 26 and feedback element 28, form a filter network. The configuration of filter 20 shown is obviously only to be considered an example and may be modified within a wide range by a method of prior art.

A peculiarity of converter 10 consists in the fact that a feedback signal corresponding to the differentiated output signal OUT of quantifier 30 is generated by means of feedback device 40 and is fed back to a point on filter 20, namely addition point 24-3. This addition point 24-3 forms at its output the input signal for integrator 22-3, which is connected directly downstream of quantifier 30.

The feedback signal corresponding to the differentiated output signal OUT is in this case generated by the mutual subtraction of two signals, which correspond to different time-delayed versions of output signal OUT. As shown in FIG. 1, addition point 24-2 is also used for the subtraction of the two signals by transmitting the signals to this addition point 24-3, with opposite polarity. The two signals are generated by branching output signal OUT to a node 50 (at the output of quantifier 30) and subjecting them to different delays. In FIG. 1 this different delay is represented by two delay elements 42-$a$ and 42-$b$, each with a downstream connected coupling element 44-1 and 44-2 respectively, symbolizing a certain amplification (or attenuation) or weighting.

A conventional feedback path, which leads from branching node 50 (via delay element 42-$a$) to addition point 24-1, can be seen in FIG. 1.

Since the functional block diagram in FIG. 1 only reproduces the mathematical operations on the individual signals, independently of their representation (analog or digital), the digital analog conversion required in the feedback paths in the circuit implementation is not shown. A possible circuit implementation of converter 10 is explained in the following with reference to FIG. 2.

Figure 2:
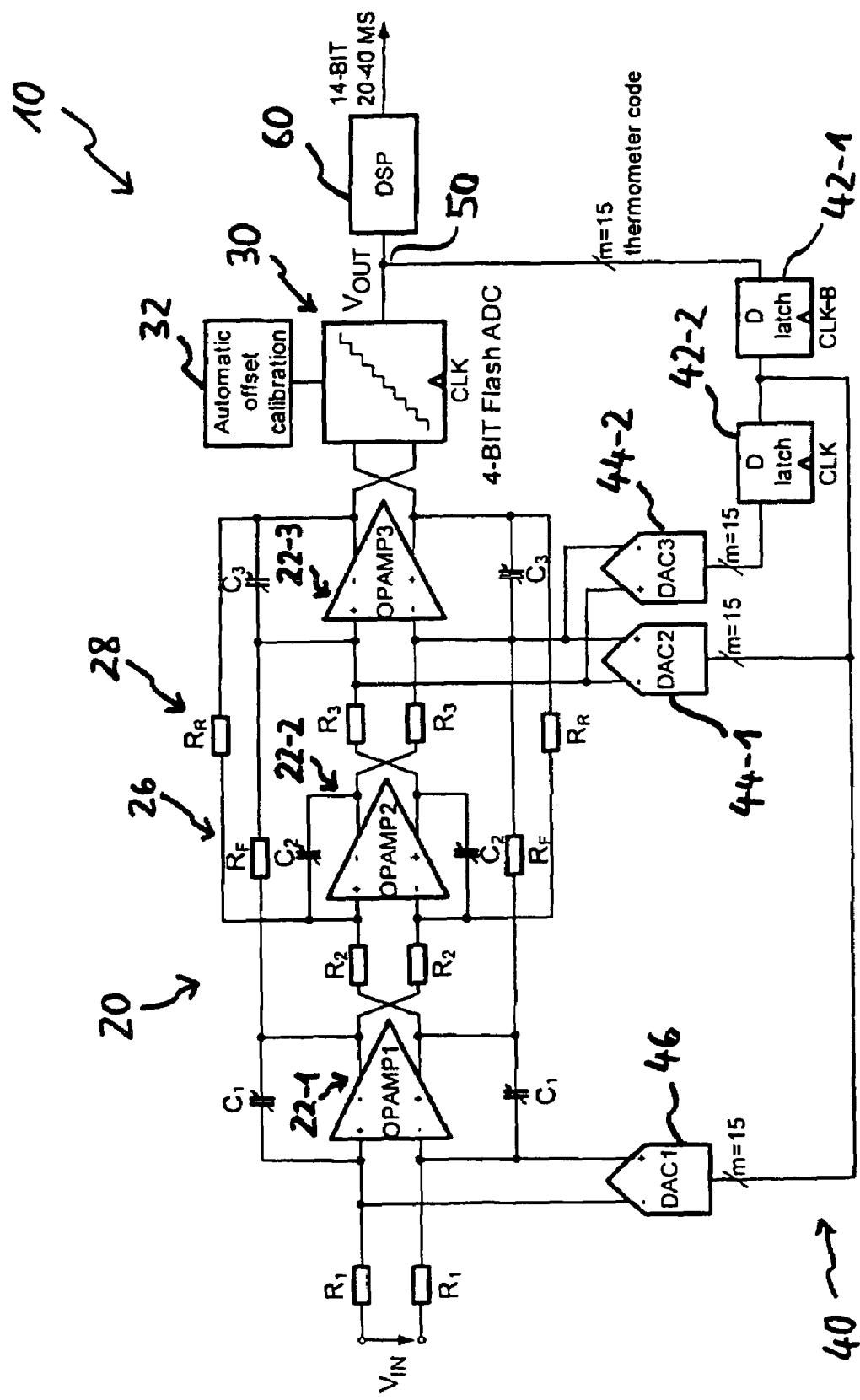
FIG. 2 shows a block diagram of the converter in FIG. 1.

FIG. 2 shows a detailed block diagram of delta-sigma analog digital converter 10, where the same reference numbers as in FIG. 1 are used for components with the same action In the implementation shown, integrators 22-1, 22-2 and 22-3 of analog filter 20 are each realized by suitably externally switched operational amplifiers OPAMP1, OPAMP2 and OPAMP3. Analog input signal IN is represented by an input voltage $V_{IN}$ and the digital output signal is represented by an output voltage signal $V_{OUT}$.

Quantifier 30 has 16 quantification stages and represents output signal OUT in a thermometer coding on 15 output lines which, for the sake of the simplicity of the representation in FIG. 2, are symbolized only by a single line connection. Quantifier 30 is constructed for this purpose, by a method of prior art, as a parallel connection of 15 comparators with 15 comparator thresholds arranged in a "conductor". A common clock signal CLK is transmitted to the comparators simultaneously, via which signal the respective comparisons of the filtered input signal with the comparator thresholds are carried out at time-discrete periodic times so that a 4-bit output signal OUT, supplied cycled, is present at the output of quantifier 30. The physical representation is provided according to the thermometer coding in 15 digital voltages (symbolized by $V_{OUT}$).

A calibration circuit 32 is provided for accurate setting of the comparator thresholds in the operation of converter 10. A digital signal processor (DSP) 60, for further digital processing of the bit stream output by quantifier 30, is also seen in FIG. 2.

Feedback device 40 of converter 10 is formed essentially by circuit components 42-1, 42-2, 44-1, 44-2 and 46 described in the following. These components are resented only by simple drawing in FIG. 2 for the sake of simplicity of the representation. These components are actually provided 15-fold, parallel with each other, according to the processing of the signal transmitted via 15 lines corresponding to a thermometer coding.

The conventional feedback path from branching node 50 to first integrator 22-1 of analog filter 20 is realized by a digital signal accumulator 42-1 designed as a so-called "latch" and operated in cycled manner by clock signal CLK (more precisely: the inverted version CLK-B of clock signal CLK), to which accumulator digital output signal OUT is transmitted and whose output signal is in turn transmitted to the input of a digital analog converter 46. The output signal of digital analog converter 46 is transmitted as a fully differential current signal to integrator 22-1. The addition symbolized at 24-1 in FIG. 1 is carried out by a corresponding addition on the one hand of the currents supplied via coupling-in resistances R1 and on the other hand of the currents supplied at the output of digital analog converter 46.

Latch 42-1 is a register whose output signal follows the input signal when the input clock signal CLK-B is in a particular condition of the two possible clock signal conditions (The clock signal serves to a certain extent as a "permission signal"). In the conventional use of a square wave clock signal CLK, which has a logic level "1" during the first half of a cycle period T, and a logic level "0" during the second half of the cycle period, output signal OUT, delayed by half the cycle period of clock signal CLK, is generated at the output of signal accumulator 42-1. From the circuit point of view, signal accumulator 42-1 drawn in FIG. 2, consists of a parallel arrangement of 15 1-bit signal accumulators for the parallel delay of the signal levels shown on 15 lines.

Output signal OUT delayed by signal accumulator 42-1 by half a cycle period is also transmitted to the input of a digital analog converter 44-1, which supplies at its output a fully differential signal (corresponding to the result of the digital analog conversion). Moreover, the output signal of digital signal accumulator 42-1 is transmitted to the input of a second digital signal accumulator 42-2 which is constructed similarly to first signal accumulator 42-1, but is operated in a cycled manner with the non-inverted clock signal CLK. Second signal accumulator 42-2 again delays the signal transmitted to it by half a cycle period of clock signal CLK, so that a version of output signal OUT generally delayed by a whole cycle period T of clock signal CLK is supplied to the output of second signal accumulator 42-2 because of the arrangement of signal accumulators 42-1 and 42-2 acting as delay elements one behind the other. This output signal of second signal accumulator 42-2 is transmitted to the input of a digital analog converter 44-2 which (like digital analog converter 44-1) supplies a fully differential current signal which, like the output signal of digital analog converter 44-1, is fed into the region of integrator 22-3. The superposition of the different currents shown in FIG. 2 in the region of integrator 22-3 is the physical realization of addition point 24-3 shown in the functional block diagram in FIG. 1.

The two signal accumulators 42-1, 42-2 and the two digital analog converters 44-1, 44-2 together form a functional block of feedback device 40 for generating a feedback signal corresponding to differentiated output signal OUT of quantifier 30. In this case the generation of this differentiated signal is based on the analog subtraction of two signals which are supplied from the digital output signal by the provision of different delays and in each case by a digital analog conversion.

The two different signal delays are preferably chosen, as shown, as a first delay by half a cycle period and a second delay by a whole cycle period (cf. $z^{-1/2}$ and $z^{-1}$ in FIG. 1). In the circuit realization in FIG. 2, this first delay is effected by first signal accumulator 42-1 and the second signal delay is effected by the connection of the two signal accumulators 42-1, 42-2 one behind the other.

The generation of the signal corresponding to the differentiated output signal OUT by the functional block of feedback device 40 described is explained one again in the following with reference to FIG. 3.

FIG. 3 once again shows, in its upper half, components 42-a, 42-b, 44-1, 44-2 and 24-3, which are used for generating the differentiated signal, here denoted by reference number 3.

Differentiated signal 3 is generated by the subtraction of signal 2, delayed by a whole cycle period, from signal 1 delayed by half a cycle period.

Figure 3:
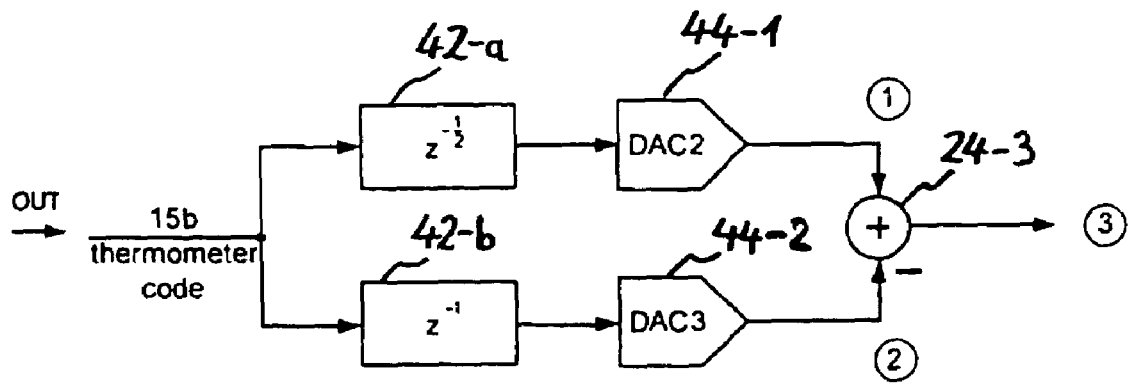
FIG. 3 shows a block diagram of a detail from FIG. 2 and time curves for signals generated on it.
Figure 3:
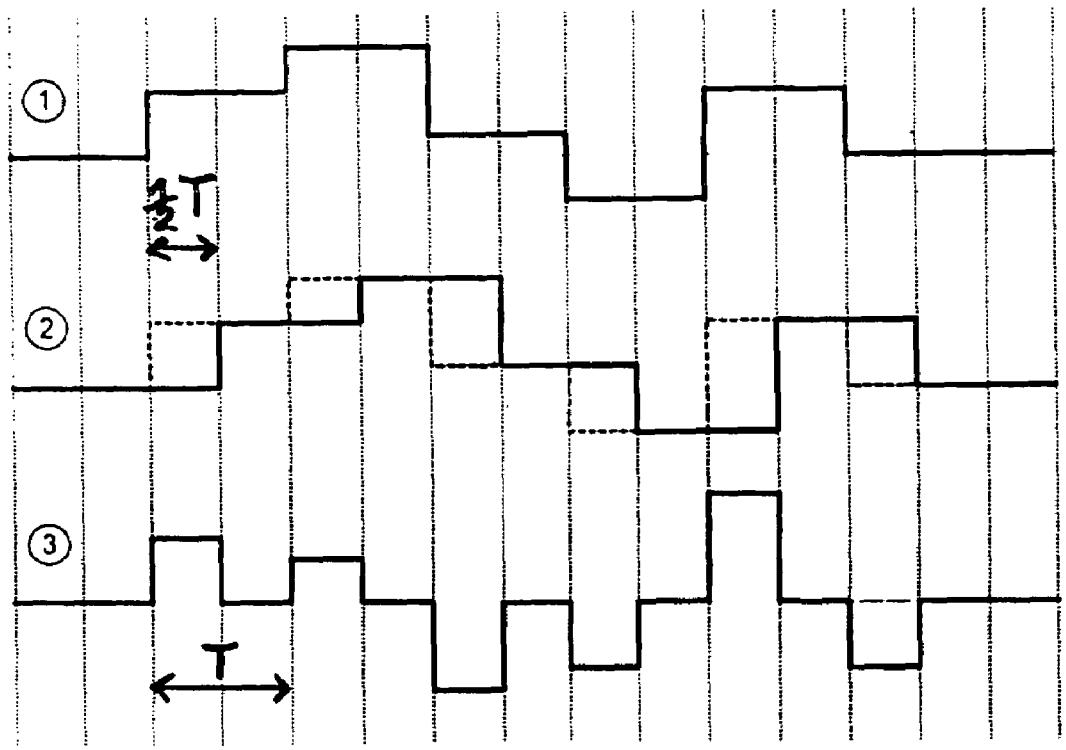

Exemplary curves of signals 1, 2 and 3 are represented in the lower half of FIG. 3 on a common time axis (cycle period T). As can easily be seen in this representation, signal 3 obtained by subtraction (or by addition with an opposite prefix), represents a (quantified) approximation for the time derivation of the transmitted signal OUT. When using signal 3 for feedback in a delta-sigma digital analog converter it is particularly advantageous here for this signal 3 to represent a so-called "return-to-zero" signal, i.e. a signal which returns to the value of zero after the expiration of half a cycle period T/2.

Although the feedback signal corresponding to the differentiated output signal of the quantifier is coupled directly into the analog filter in the exemplary embodiment described above, this is by no means compulsory. In contrast to the exemplary embodiment described, this signal could first be subjected to further processing before being coupled in at the point described or any other point in the filter.

The invention claimed is:

1. A continuous-time delta-sigma analog digital converter for converting an analog input signal (IN) to a digital output signal (OUT), comprising:
   an analog filter (20) which filters the analog input signal,
   a quantifier (30) cycled by a clock signal (CLK), which quantifier quantifies the filtered analog signal transmitted by analog filter (20) for generating the digital output signal, and a feedback device (40) with at least one digital analog converter, which device transmits at least one analog feedback signal to analog filter (20) on the basis of the digital output signal (OUT), characterized in that the feedback device (40) comprises a first digital analog converters (44-1) for generating a feedback signal corresponding to a delayed output signal of the quantifier, to which converters the digital output signal (OUT) of the quantifier (30) is transmitted via a first delay element (42-1) with a first delays, wherein a second delay element (42-2) is provided, to which the digital output signal delayed by the first delay is transmitted, and which supplies this signal delayed by a second delay at the input of a second digital analog converter (44-2), wherein the analog output signals of the two digital analog converters (44-1, 44-2) are transmitted to an analog subtractor (24-3) for generating a feedback signal corresponding to a differentiated output signal of the quantifier (30).

2. The converter according to claim 1, wherein the feedback signal corresponding to the differentiated output signal of the quantifier is transmitted to an integrator (22-3) of the analog filter (20).

3. The converter according to claim 1, wherein the output signal of the quantizer (30) delayed by the first delay is transmitted to at least one further digital analog converter (46) of the feedback device (40).

4. The converter according to claim 1, wherein the first delay and the second delay are each equal to half a cycle period of the clock signal (CLK).

5. The converter according to claim 1, wherein the delay elements (42-1, 42-2) are each designed as digital signal accumulators cycled by the clock signal (CLK).

6. The converter according to claim 1, wherein the analog output signals of the two digital analog converters (44-1, 44-2) are current signals.

7. The converter according to claim 1, wherein the quantifier (30) has a plurality of quantification stages.

8. The converter according to claim 1, wherein the digital output signal (OUT) of the quantifier (30) has a thermometer coding.

9. A method for continuous-time delta-sigma analog digital conversion for converting an analog input signal (IN) to a digital output signal (OUT), comprising:

an analog filtering (20) of the input signal, a quantification (30) of the filtered analog signal cycled by a clock signal for generating the digital output signal (OUT), and a feedback (40) comprising at least one digital analog conversion for supplying at least one analog feedback signal on the basis of the digital output signal during analog filtering, characterized in that the feedback (40) for generating a feedback signal corresponding to a delayed output signal of the quantification (30) comprises a first digital analog conversions (44-1), wherein the digital output signal (OUT) of the quantification (30) is subject with a first delay to the first digital analog conversions (44-1), wherein the digital output signal delayed by the first delay further is subject with a second delay to a second digital analog conversion (44-2) and the two digital analog converted signals are subtracted from each other (24-3) for generating a feedback signal corresponding to a differentiated output signal of the quantification (30).

* * * * *